United States Patent
Gisby et al.

(10) Patent No.: US 10,228,396 B2
(45) Date of Patent: Mar. 12, 2019

(54) SELF-SENSING DIELECTRIC ELASTOMER DEVICE

(71) Applicant: Auckland Uniservices Limited, Auckland (NZ)

(72) Inventors: Todd Alan Gisby, North Shore City (NZ); Thomas Gregory McKay, Auckland (NZ); Ho Cheong Lo, Auckland (NZ); Benjamin Marc O'Brien, Auckland (NZ); Iain Alexander Anderson, Auckland (NZ)

(73) Assignee: Auckland Uniservices Limited, Auckland (NZ)

( * ) Notice: Subject to any disclaimer, the term of this patent is extended or adjusted under 35 U.S.C. 154(b) by 8 days.

(21) Appl. No.: 14/407,840

(22) PCT Filed: Jun. 14, 2013

(86) PCT No.: PCT/NZ2013/000103
§ 371 (c)(1),
(2) Date: Dec. 12, 2014

(87) PCT Pub. No.: WO2013/187781
PCT Pub. Date: Dec. 19, 2013

(65) Prior Publication Data
US 2015/0123647 A1 May 7, 2015

(30) Foreign Application Priority Data

Jun. 14, 2012 (AU) ................................ 2012902480

(51) Int. Cl.
*H02N 2/18* (2006.01)
*G01D 5/16* (2006.01)
(Continued)

(52) U.S. Cl.
CPC ............... *G01R 19/00* (2013.01); *G01D 5/16* (2013.01); *H01L 41/042* (2013.01); *H02N 2/181* (2013.01)

(58) Field of Classification Search
CPC .......... G01R 19/00; G01D 5/16; H02N 2/181; H01L 41/042
See application file for complete search history.

(56) References Cited

U.S. PATENT DOCUMENTS 9,170,288 B2 * 10/2015 O'Brien ................ H01L 41/042
2010/0164324 A1 7/2010 Kim et al.
(Continued)

FOREIGN PATENT DOCUMENTS

WO WO-2012053906 A1 4/2012

OTHER PUBLICATIONS

Dielectric Elastomer Actuators for Tactile Displays, Matysek M., Lotz P., Winterstein T., Schlaak H., Third joint Eurohaptics Conference and Symposium on Haptic Interfaces for Virtual Environment and Teleoperator Systems, Salt Lake City, UT, USA, Mar. 18-20, 2009.*

(Continued)

*Primary Examiner* — Julian D Huffman
*Assistant Examiner* — Michael T Konczal
(74) *Attorney, Agent, or Firm* — Schwegman Lundberg & Woessner, P.A.

(57) ABSTRACT

The invention provides circuits, systems and methods for dielectric elastomer device (DED) self-sensing. The circuit comprises a first DED coupled or adapted for coupling to a first voltage source (for providing an actuating or priming signal, for example); a current sensor provided in series with the first DED; and an oscillating signal source coupled to the first DED and adapted to cause an oscillation in a voltage (Continued)

across the DED, wherein the oscillating signal source is decoupled from the first voltage source.

30 Claims, 7 Drawing Sheets

(51) Int. Cl.
  *G01R 19/00* (2006.01)
  *H01L 41/04* (2006.01)

(56) References Cited

U.S. PATENT DOCUMENTS

| 2012/0086366 | A1 | 4/2012 | Anderson et al. |
| 2012/0299514 | A1* | 11/2012 | Anderson ............ H01L 41/107 |
| | | | 318/116 |
| 2014/0266832 | A1* | 9/2014 | Schrom ................ H02M 3/157 |
| | | | 341/144 |

OTHER PUBLICATIONS

International Application No. PCT/NZ2013/000103, Search Report and Written Opinion dated Aug. 2, 2013, 8 pgs.

* cited by examiner

SELF-SENSING DIELECTRIC ELASTOMER DEVICE

This application is a U.S. National Stage Filing under 35 U.S.C. 371 from International Application No. PCT/NZ2013/000103, entitled "SELF-SENSING DIELECTRIC ELASTOMER DEVICE," filed on Jun. 14, 2013, and published as WO 2013/187781 A1 on Dec. 19, 2013, which claims the benefit of priority to Australian Patent Application No. 1012902480, filed on month Jun. 14, 2012, which are hereby incorporated by reference herein in their entireties.

FIELD OF THE INVENTION

This invention relates to a dielectric elastomer device (DED) circuit and method. More particularly, though not exclusively, the invention relates to a dielectric elastomer generator (DEG) circuit and method which enables self-sensing.

BACKGROUND

Dielectric elastomer devices (DED), whether actuators (dielectric elastomer actuators, or DEA) or generators (dielectric elastomer generators, or DEG), are useful transducer devices which may be used for converting electrical energy to mechanical energy or vice versa. DEDs have some unique properties with respect to traditional actuators/generators, such as being inherently compliant, which make them particularly suitable for some applications.

A DED typically comprises a dielectric elastomer membrane 11 sandwiched between opposing compliant electrodes 12. The dielectric elastomer membrane 11 is compressed by electrostatic pressure when a high voltage is applied across the electrodes 12 in the manner of a capacitor, causing planar expansion of the membrane from an uncompressed or contracted state to a compressed or expanded state.

As is the case with traditional transducers of the prior art, in many applications it is useful or necessary to have some feedback regarding the state of the device. This feedback may be used for closed-loop control, or detecting whether a device is operating near its limits (i.e. to identify to limit the risk of imminent failure of the device), for example. Traditional transducers of the prior art would thus typically be fitted with some external sensors (such as micro-switches, strain gauges, optical sensors etc.) to directly measure or detect movement of the device. The required external sensors increase the component count and complexity of the actuator.

One advantage of DEDs is that feedback on the state of a DED can be obtained solely from measurable electrical characteristics of the actuator/generator transducer itself, referred to as self-sensing, preferably dynamically (e.g. as a DEA is actuated or a DEG is mechanically deformed). In particular, because the membrane of a DED is preferably volumetrically incompressible, it is possible to relate a change in capacitance between electrodes of the DED to changes in the physical geometry of the DED. External sensors are therefore not required. A self-sensing DED is thus multifunctional—by monitoring its geometry, the DED can act as a strain or pressure sensor while simultaneously functioning as an actuator or generator (i.e. a self-powered sensor). An estimate of the capacitance of the DED can also be used to provide additional useful feedback data regarding the electrical state of the DED including the charge and leakage current which may be indicative of the health of the DED. External sensors do not directly provide any feedback regarding the electrical state of a DED.

As the charge on a DED increases, so too does the electric field and electrostatic pressure. If the electric field is allowed to grow too large the DED will undergo dielectric breakdown. When this happens the charge on the DED will be rapidly discharged through the thickness of the membrane 11, generating significant heat and often resulting in catastrophic failure of the DED. Monitoring the leakage current can also enable detection of the precursors to dielectric breakdown and failure of the DED.

Due to the high voltages necessary for efficient DEDs, implementing capacitive self-sensing is not as simple as applying the capacitive sensing techniques commonly applied in other fields. Nonetheless, self-sensing methods have previously been developed and used to provide feedback in DEA systems.

International Patent Publication No. WO 2009/01515, for example, discloses a self-sensing dielectric actuator system in which a relatively high frequency sensing signal is superimposed on a low-frequency actuating signal by a signal mixer, and deformation of the actuator is estimated from changes in the sensing signal.

International Patent Publication No.'s WO 2010/095960 and WO 2012/053906 each disclose a method and system for estimating the capacitance between opposing electrodes of a DEA dynamically (i.e. as the DED is actuated) by measuring only the voltage difference between the electrodes and a series current supplied to the DEA. Using the capacitance estimate, the charge and leakage current can also be estimated.

However, there are several potential disadvantages to such systems and methods.

Firstly, due to the high voltages typical in DED systems, the prior art methods require relatively expensive high voltage electronic components in introducing the required oscillation in the actuation signal, whether it be a floating oscillating signal source or a signal mixer. The oscillation may alternatively be generated by the actuation signal source itself (e.g. using pulse width modulation), but this complicates the design.

Secondly, the methods cannot be easily applied to implement self-sensing in a DEG system. The method and system of WO 2010/095960, for example, requires the voltage of the DEA to be oscillated at least during self-sensing. This oscillation can be provided by an oscillating high voltage supply or using high voltage switching to rapidly charge/discharge the DE actuator. The self sensing method thus induces a small scale voltage oscillation across the DEA while simultaneously actuating it. The response of the DEA to the induced ripple enables its strain state and electrical state to be derived.

However, a DEG generator operates somewhat differently to a DEA, and the control circuits/strategies for controlling the DEG are not conducive to the DEA self-sensing systems and methods of the prior art.

Figure 1:
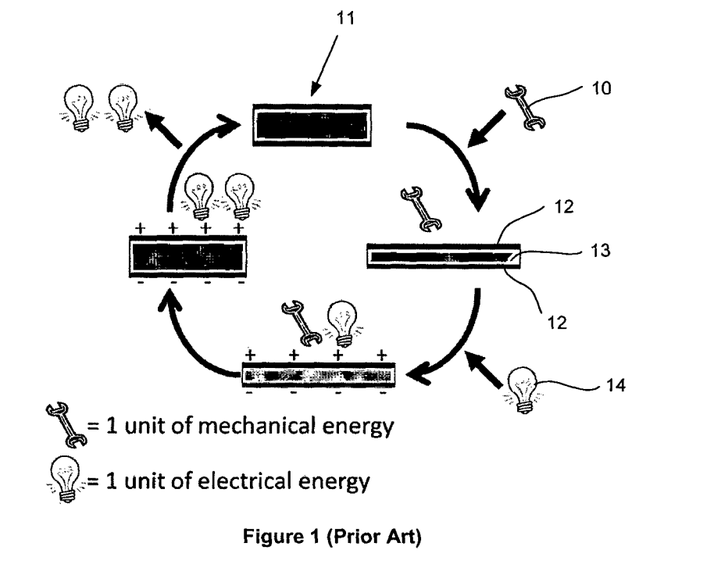
FIG. 1 is a diagrammatic illustration of the four steps required for generating power from a dielectric elastomer generator.

A DEG generates electrical energy by increasing the electric potential energy stored in it. The steps to achieve this are illustrated diagrammatically in FIG. 1. Starting from the top of FIG. 1, mechanical energy 10 is initially applied to the DEG 11 by stretching it. This results in a planar expansion of electrodes 12 and an orthogonal compression of the membrane 13, leading to an increased capacitance. Electrical energy 14 is then input to the DEG by charging or priming from an electric power source (not shown) so that opposing electrodes 12 become oppositely charged. Relaxing the DEG will convert the mechanical energy into electrical energy by forcing apart the opposite charges (+ and −) on opposing electrodes 12, and forcing the like charges on each electrode 12 closer together due to the planar contraction thereof. The electrical energy 14 is extracted and the cycle repeats.

To provide the priming charge, the DEG system preferably comprises a self-priming circuit such as that disclosed by International Patent Publication No. WO 2011/005123. However, the self-priming circuit does not provide a constant connection between a high voltage power source and the DEG as required for the self-sensing DEA method of WO 2010/095960.

OBJECT OF THE INVENTION

It is therefore an object of the invention to provide a self-sensing DED system and/or a method for DED self-sensing which overcomes or at least ameliorates one or more disadvantages of the prior art, or alternatively to at least provide the public with a useful choice.

Further objects of the invention will become apparent from the following description.

SUMMARY OF INVENTION

In a first aspect, the present invention may broadly be said to consist in a self-sensing dielectric elastomer device (DED) circuit comprising:
  a first DED coupled or adapted for coupling to a first voltage source;
  a current sensor provided in series with the first DED; and
  an oscillating signal source coupled to the first DED and adapted to cause an oscillation in a voltage across the DED, wherein the oscillating signal source is decoupled from the first voltage source.

The coupling between the oscillating signal source and the first DED may be either direct or indirect.

The first voltage source may be adapted to provide an actuating signal or a priming signal, for example, and may be further adapted to selectively sink current from the DED.

Preferably the oscillating signal source is a ground-referenced signal source.

Preferably the oscillating signal source is coupled to a low voltage electrode of the first DED. More particularly, the oscillating signal source is preferably provided in series with the DED and current sensor, and more preferably is coupled between the current sensor and ground. In this embodiment, a high voltage electrode of the first DED is coupled or adapted for coupling to a first voltage source.

Alternatively, the oscillating signal source may be coupled to a low-voltage electrode of a capacitor provided in parallel with the first DED. More particularly, the oscillating signal source is preferably provided between a low-voltage electrode of the capacitor and ground, the oscillating signal source and capacitor together being provided in parallel with the DED.

Preferably the current sensor is coupled to a low-voltage electrode of the DED.

Preferably the oscillating signal source produces a sinusoidal or square wave oscillating signal. Any other suitable oscillating signal waveform may alternatively be used, however.

Preferably the DED comprises a dielectric elastomer generator (DEG). In that case, the first voltage source is preferably adapted to selectively source and sink current to/from the DED, to prime and discharge the DED respectively.

Alternatively, the DED may comprise a dielectric elastomer actuator (DEA). In that case, the first voltage source is adapted to provide an actuating signal to the DEA. The actuating signal will generally be a much higher voltage than the oscillating signal.

Preferably the circuit further comprises a voltage sensor provided in parallel with the first DED.

Preferably the circuit comprises one or more further DEDs, each provided in parallel with the first DED, and a further current sensor provided in series with each of the one or more further DEDs.

Alternatively, the circuit may comprise one or more further DEDs each provided in series with the first DED. Preferably a further voltage sensor is coupled to a high-voltage electrode of each of the one or more further DEDs.

Preferably the or each current sensor comprises a series resistor provided between a pair of terminals coupled to a differential amplifier.

Preferably the voltage sensor comprises a voltage divider.

Preferably the oscillating signal source has no DC offset.

In a second aspect, the invention may broadly be said to consist in a self-sensing DED system comprising a self-sensing DED circuit according to the first aspect of the invention.

Preferably the DED comprises a DEG, and the system further comprises a charge control circuit provided in parallel with the self-sensing DED circuit. In particular, the charge control circuit preferably comprises a self-priming circuit.

Alternatively, the DED may comprise a DEA, and the system further comprises the first voltage source in parallel with the self-sensing DED circuit to selectively actuate the DEA.

Preferably the system further comprises a computing device communicatively coupled to the or each current sensor. The computing device is preferably also communicatively coupled to the or each voltage sensor.

Preferably the computing device is adapted to receive measurements from at least the or each current sensor, and calculate at least one feedback parameter regarding the state of the DED based at least in part on the received measurements. Preferably the feedback parameter is indicative of one or more of the area, deformation, capacitance, charge and/or leakage current of the DED.

Preferably the computing device is adapted to calculate the at least one feedback parameter by way of a plane approximation method, and in particular a hyperplane approximation method.

In a third aspect the present invention may broadly be said to consist in a dielectric elastomer device (DED) self-sensing method comprising the steps of:
  providing an oscillating voltage to a first DED, the oscillating voltage being decoupled from a first voltage source also coupled to the DED;
  receiving measurements of current in series with the first DED; and
  calculating at least one feedback parameter regarding the state of the first DED, based at least in part on the current measurements.

Preferably the oscillating voltage is a ground-referenced oscillating voltage signal.

Preferably the oscillating voltage is a low-voltage signal independent from a high-voltage signal supplied by the first voltage source.

Preferably the step of providing the oscillating voltage to the first DED comprises at least one of:
providing the oscillating voltage to a low-voltage electrode of the DED; and
providing the oscillating voltage to a low-voltage electrode of a capacitor in parallel with the DED.

Preferably the method further comprises receiving measurements of voltage across the first DED, and calculating at least one feedback parameter regarding the state of the first DED based at least in part on both the current measurements and the voltage measurements.

Preferably the step of calculating the at least one feedback parameter is performed by a computing device, wherein the computing device receives the current and optional voltage measurements as input data and calculates said feedback parameter by processing the measurements. The feedback parameter is preferably represented by a state-sensing signal generated by the computing device.

Preferably the method further comprises receiving measurements of current in series with one or more further DEDs provided in parallel with the first DED, and calculating at least one feedback parameter regarding the state of each of the further DEDs based at least in part on the respective current measurements.

Alternatively, the method may comprise receiving measurements of voltage across one or more further DEDs provided in series with the first DED, and calculating at least one feedback parameter regarding the state of each of the further DEDs based at least in part on the current measurements and the respective voltage measurements of each of the further DEDs.

Preferably the feedback parameter is indicative of one or more of the area, deformation, capacitance, charge and/or leakage current of the DED.

Preferably the method further comprises the step of recording current and/or voltage measurements with respect to time.

Preferably the step of calculating at least one feedback parameter comprises the steps of:
calculating the charge supplied to the DED with respect to time from the current measurements; and
calculating one or more feedback parameters from coefficients of a plane of best fit through at least the charge and voltage measurements with respect to time, when defined as orthogonal axes.

Preferably the step of calculating one or more feedback parameters comprises calculating the capacitance of the DED from the slope along the voltage-charge axes.

Preferably the step of sensing a current in series with the DED comprises measuring the voltage difference across a resistor provided in series with the DED.

Preferably the step of sensing the voltage of the DED comprises measuring a voltage in a voltage divider provided in parallel with the DED.

In a fourth aspect, the present invention may broadly be said to consist in a method for controlling a DED, comprising:
obtaining feedback regarding the state of a DED according to the self-sensing method of the third aspect of the invention; and
controlling the DED at least in part on the basis of said feedback.

Preferably the DED comprises a DEG, wherein the method further comprises:
priming the DEG upon mechanical deformation thereof by supplying electrical energy to a high-voltage electrode of the DEG; and
extracting electrical energy from the high-voltage electrode upon relaxation of the DEG.

Preferably, the feedback is used to control the stiffness of the DEG to tune resonance.

Preferably the feedback is used to control the voltage across the DED to limit the leakage current.

Alternatively, the DED may comprise a DEA, wherein the method further comprises actuating the DEA by supplying an actuation voltage correlating with an error between a desired state of the DEA and a sensed state of the DEA indicated by the feedback.

In a fifth aspect the present invention may broadly be said to consist in a method of sensing a state of a dielectric elastomer device, the method characterised by the steps of:
providing a ground-referenced oscillating signal to the dielectric elastomer device;
sensing a current in series with dielectric elastomer device; and
generating a state-sensing signal dependent on the sensed current.

The sensing signal may be used as feedback on the state of the dielectric device.

In a sixth aspect the invention may broadly be said to consist in sensing mechanical strain and/or movement using a dielectric elastomer device having a high voltage electrode and a low voltage electrode, the method characterised by the steps of:
oscillating voltage at the low-voltage electrode of the device;
sensing a series current through the dielectric device; and
generating a state-sensing signal dependent on the sensed current to sense the state of the strain and/or movement.

In a seventh aspect, the invention may broadly be said to consist in a dielectric elastomer device circuit comprising:
a dielectric elastomer device coupled or coupleable to a first voltage source; and
an oscillating signal source coupled to the dielectric elastomer device;
wherein the first voltage source and dielectric elastomer device are coupled to each other by a DC-blocking capacitor. The dielectric elastomer device may form the DC-blocking capacitor, or the DC-blocking capacitor may comprise a capacitor provided in parallel with the dielectric elastomer device.

Further aspects of the invention, which should be considered in all its novel aspects, will become apparent from the following description.

DRAWING DESCRIPTION

A number of embodiments of the invention will now be described by way of example with reference to the drawings in which:

FIG. 12 shows example waveforms for the (a) capacitance; and (b) voltage of a dielectric elastomer generator in a circuit according to a further embodiment of the invention.

DETAILED DESCRIPTION OF THE DRAWINGS

Throughout the description like reference numerals will be used to refer to like features in different embodiments. For the purpose of the description and claims, the terms "low voltage" and "high voltage" refer to relative differences in the voltage magnitude of respective signals, rather than any specific numerical voltage ranges. In particular, a "high voltage" signal preferably has a magnitude of the order of at least several times greater than that of a "low voltage" signal in the same circuit, and more preferably an order of magnitude greater.

The contents of WO 2010/095960, WO 2011/005123 and WO 2012/053906 are incorporated herein by reference.

Figure 2:
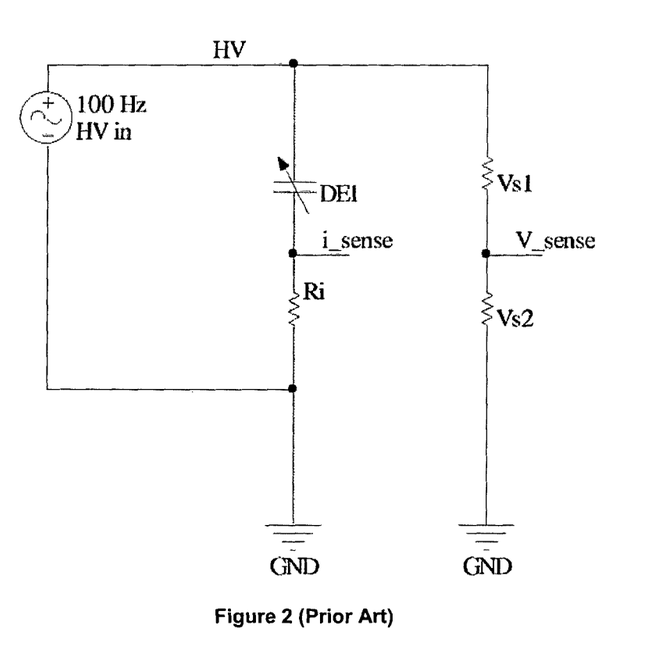
FIG. 2 is a schematic of a self-sensing dielectric elastomer actuator circuit according to the prior art.

A self-sensing dielectric elastomer actuator (DEA) circuit of the prior art is shown in FIG. 2. Self-sensing is achieved by interrogating current and voltage oscillations across the DE. The required oscillations are conveniently combined with the high voltage actuation or driving signal HV by either using a power supply with a suitable output ripple (HV in) as shown, or rapidly switching the connection between the high voltage supply and DE (e.g. using pulse width modulation, PWM). The major components include the DE (DE1), an oscillating high voltage supply (HV in), a DE series current sensor (Ri and terminal i_sense), and a high voltage sensor (the voltage divider comprising series resistors Vs1 and Vs2 and terminal V_sense).

As briefly explained above, there are two major disadvantages with the prior art DEA self-sensing circuit which combines the self-sensing oscillations with the high voltage supply.

Firstly, it is not suitable for many dielectric elastomer generator (DEG) circuits because DEG systems generally have a phase in each generation cycle during which the DEG has a fixed charge (i.e. no current is flowing between the DEG and the priming circuit). This means no current is supplied by the priming circuit, and the oscillation through the DEG required for self-sensing is not obtainable.

Secondly, the prior art DEA self-sensing circuit requires high voltage electronics, capable of handling voltages potentially exceeding 1000 V, to provide the oscillations. Because high voltage electronics suitable for DEDs are not produced in large volumes, they are typically expensive.

The present invention provides an alternative circuit/system and/or method for DEG self-sensing which does not require a permanent connection to a high-voltage power supply or an oscillatory signal to be applied to the high voltage electrode of the DEG.

In the context of the present invention, the terms "high voltage" and "low voltage" are used only in the relative sense. That is, the high voltage signal merely has a greater voltage than the low voltage signal. It is not intended that the terms refer to any specific voltage ranges. It is to be further appreciated that neither the high voltage or low voltage source need necessarily by supplied to the DED continuously. In particular, where the DED comprises a DEG a high-voltage signal will generally only be supplied during the priming phase of operation. At other stages the high-voltage "source" may in fact sink current from the DEG to use or store energy generated thereby. Similarly, the oscillating low-voltage signal may only be generated when sensing is required.

Figure 3:
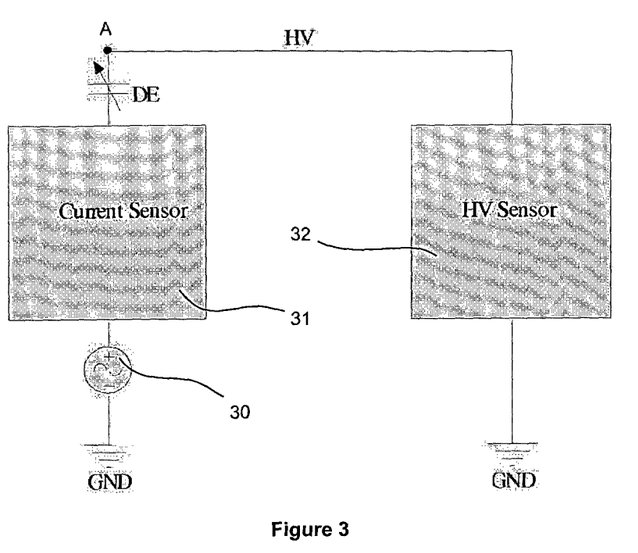
FIG. 3 a block diagram of a first embodiment of a self-sensing dielectric elastomer device circuit according to the present invention.

Referring to FIG. 3, a block diagram of a first embodiment of a self-sensing circuit according to the present invention is shown. A more detailed schematic of the circuit is provided in FIG. 4.

As shown by FIG. 3 in particular, the circuit preferably comprises a DED (represented by the variable capacitor DE), an oscillating sensing signal source 30, a current sensor 31, and a voltage sensor 32. The sensing signal source 30 and preferably the current sensor 31 are both provided in series with the return pin or low-voltage side or electrode of the DED. The voltage sensor 32 is provided in parallel with the DED, current sensor 31 and sensing signal source 30. In use, the circuit would typically be coupled to a high voltage source at terminal A. In the case of a DEG, for example, the high voltage source preferably comprises a self-priming circuit as disclosed by WO 2011/005123, to prime the DED following mechanical deformation.

The sensing signal source preferably provides a low-voltage oscillating signal having no DC offset or bias. The signal is preferably sinusoidal, but may alternatively be a square-wave for example. The frequency of the oscillating sensing signal is preferably substantially higher than that of the high-voltage signal.

From the illustrated diagram, it will be seen that the oscillating signal source 30 is essentially "decoupled" or independent from the high voltage source, or in other words only capacitively coupled with the high voltage source whereby a DC signal from the high voltage actuating or priming source is blocked by the DED or a capacitor as described below. The oscillating signal source in this embodiment is coupled between ground and a low-voltage electrode of the DED, and therefore said to be "ground-referenced". By comparison, superimposing or modulating the oscillating signal upon the high-voltage signal as in the prior art requires a "floating" oscillating signal source not referenced to ground or a signal mixer, and accordingly requires relatively expensive high-voltage electronics.

Figure 4:
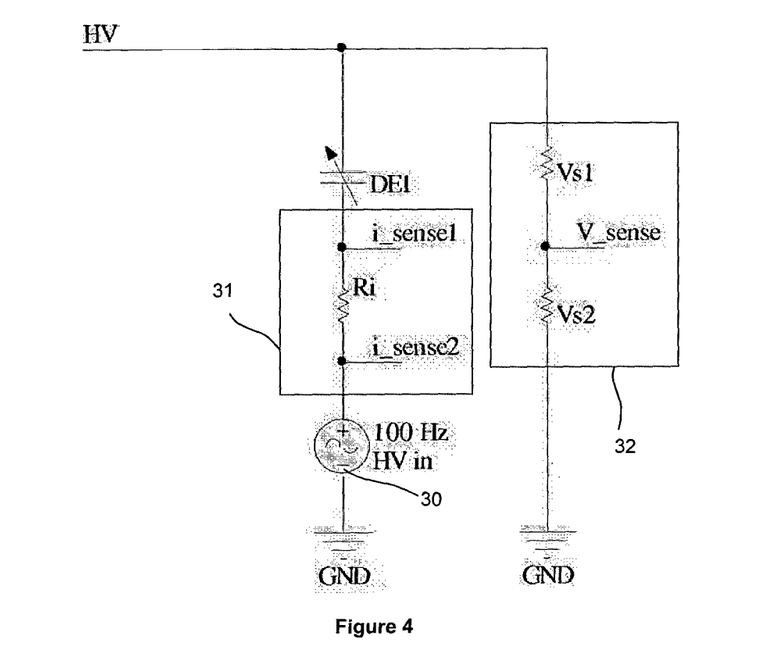
FIG. 4 is a schematic of the circuit of FIG. 3.

Referring to FIG. 4, the current sensor preferably comprises a series resistor Ri between terminals i_sense1 and i_sense2, which may be coupled to a differential amplifier, for example, to determine the potential difference across the resistor $R_i$, and thus the current through the resistor using Ohm's law. The voltage sensor preferably comprises a pair of series resistors, Vs1 and Vs2, in a voltage divider arrangement with a terminal V_sense between them. The sensing signal source 30 preferably comprises a low-voltage oscillating signal source of below 100V peak-to-peak, and more preferably below 10 V.

In a particular example of this first embodiment of the invention, the voltage difference between terminals i_sense1 and i_sense2 is used to determine the current through a 58 kΩ current sense resistor Ri, and voltage sensor resistors Vs1 and Vs2 form a 1000:1, 300 MΩ voltage divider to measure the DED voltage. The sensing signal source 30 preferably has an amplitude of 7.5V oscillating at 100 Hz, and the high voltage signal HV is 100V.

For illustrative purposes, this example circuit was tested by replacing the DED with three fixed-value test capacitors, in turn. The capacitance of each of the test capacitors was tested with a commercially available RCL meter, then estimated using the example circuit and a self-sensing method such as the hyperplane approximation method disclosed by WO 2012/053906. The results of this testing are listed in Table 1, below, together with the error as the percentage difference between the capacitance estimated according to the present invention, and the measured capacitance.

TABLE 1

| Capacitor (nominal capacitance) | Measured Capacitance | Estimated Capacitance | Error |
|---|---|---|---|
| 103Z (10 nF) | 8.9 nF | 8.7 nF | −2.2% |
| 472 (4.7 nF) | 3.8 nF | 3.5 nF | −7.9% |
| 222Z (2.2 nF) | 2.0 nF | 2.0 nF | 0% |

From these test results, it can be seen that the circuit enables a relatively accurate estimate of capacitance to be obtained from merely measurements of current and voltage. The circuit and method can thus be applied to obtain dynamic feedback from a DEA having a permanent high-voltage connection, without the pulse-width modulated actuating signal or high-voltage electronics for introducing an oscillation as required by the prior art.

Figure 5:
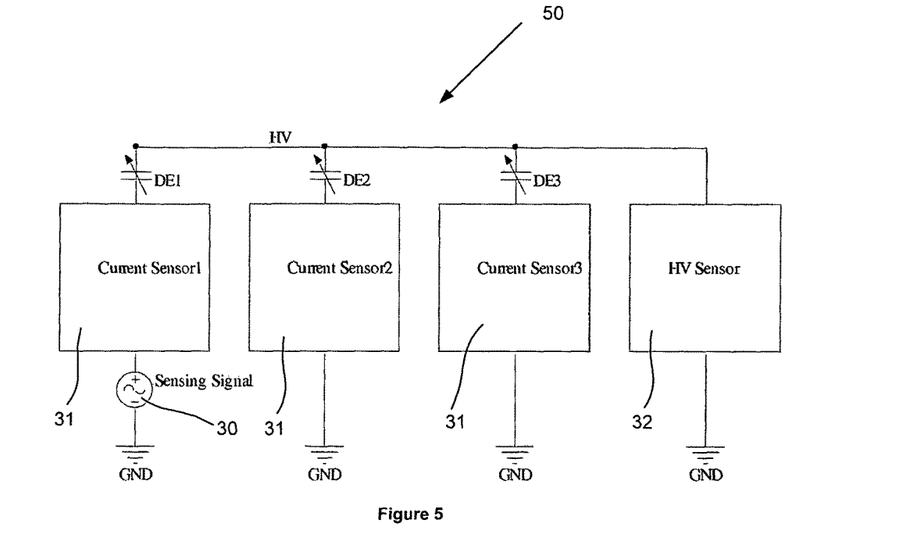
FIG. 5 is a block diagram of a second embodiment of a self-sensing dielectric elastomer device according to the present invention.

As mentioned above, however, a DEG may not always be connected to a high-voltage power supply, so when the sensing signal oscillates in the system of FIGS. 3 and 4, there is (at least periodically or intermittently) no HV supply for sinking and sourcing current. A block diagram of a second embodiment of a self-sensing circuit 50 according to the invention, addressing this issue, is shown in FIG. 5.

According to this second embodiment, a plurality of DEDs are provided in parallel with at least one oscillating sensing signal source 30 provided in series with the return pin or low voltage electrode of one of the plurality of DEDs. That DED thus effectively forms a DC-blocking capacitor between the high voltage signal source and the oscillating sensing signal source 30.

The plurality of DEDs may be formed using a single dielectric membrane by forming a plurality of pairs of electrodes on opposing sides of the membrane, thereby segmenting a single DED membrane into multiple active zones or regions, or may alternatively be formed from distinct DED membranes. Although the DEDs are not required to be deformed in phase with each other, it is generally preferable because out of phase generators will reduce the total capacitance swing. The capacitances of each of the DEDs (in particular, at a static equilibrium) are preferably substantially equal so that the current sensing circuitry requirements are the same for each DED, but in alternative embodiments the capacitances may differ without departing from the scope of the invention.

In the illustrated example of the second embodiment of the invention, the circuit comprises three DEDs, represented by variable capacitors DE1 to DE3. Each DED is provided with its own series current sensor 31, and the circuit further comprises a single voltage sensor 32 in parallel with the DEDs. Oscillation of the low-voltage sensing signal source 30 causes the plurality of DEDs to alternately source and sink current to each other. The self-sensing method thus no longer requires the high voltage power supply to sink/source current.

An additional benefit of connecting a plurality of DED in parallel is that multiple DED can be sensed using a single sensing signal and voltage sensor. Each DE requires its own current sensor, but this system does reduce the complexity of multi-zone sensing.

In other words, a multiple channel sensor can be produced using only one oscillating sensing signal which does not require high voltage electronics. Suitable compact, low-cost components are readily available.

Figure 6:
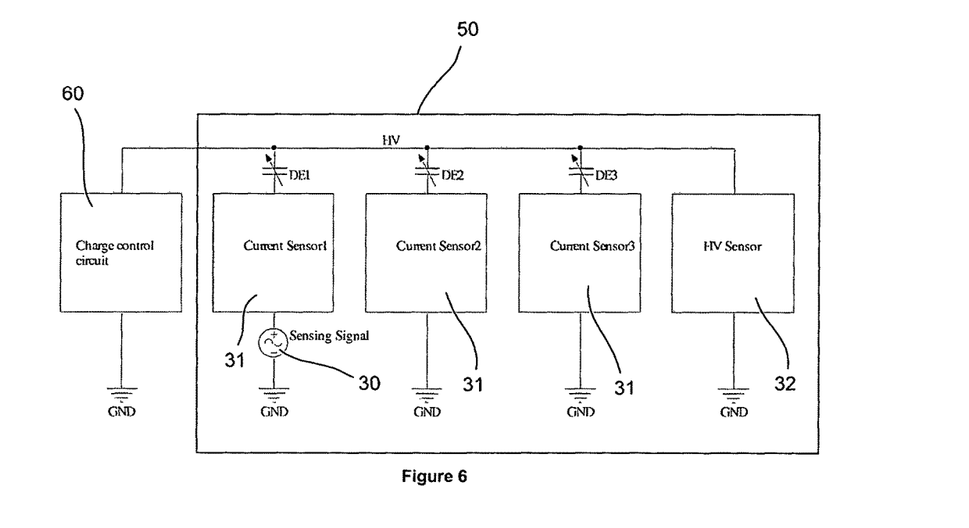
FIG. 6 is a block diagram of a dielectric elastomer generator system incorporating the circuit of FIG. 5.
Figure 7:
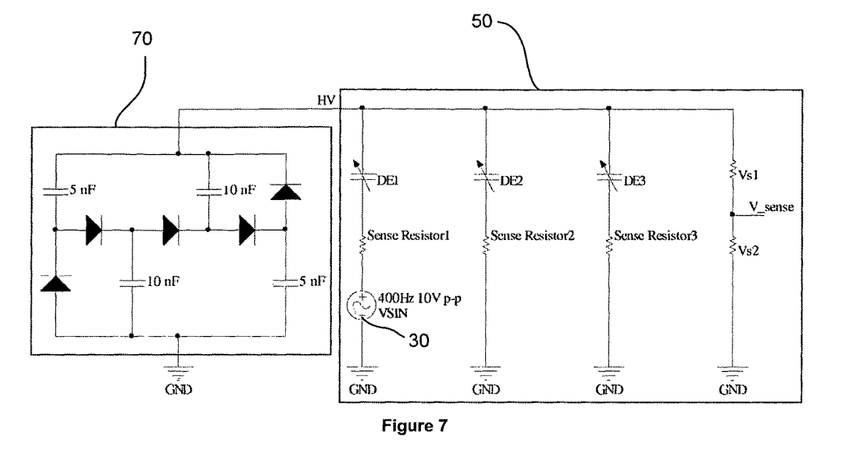
FIG. 7 is a schematic of the system of FIG. 6.

As the present invention provides a circuit and method for supplying the current and voltage oscillations required for self-sensing without the necessity of being permanently connected to a high voltage supply, it enables the implementation of a self-sensing generator. As shown in FIGS. 6 and 7, a self-sensing DEG is created by connecting the segmented, self-sensing DED circuit 50 of FIG. 5 in parallel with charge control circuitry 60. The charge control circuitry 60 preferably includes both power regulation and priming electronics, most preferably including the self-priming circuit (SPC) disclosed by WO 2011/005123, such as the two-stage SPC 70 shown in detail in FIG. 7. The charge control circuitry 60 is free to charge/discharge the DEG and the parallel DEG segments can sink/source charge during periods when the charge control circuitry does not.

Figure 8:
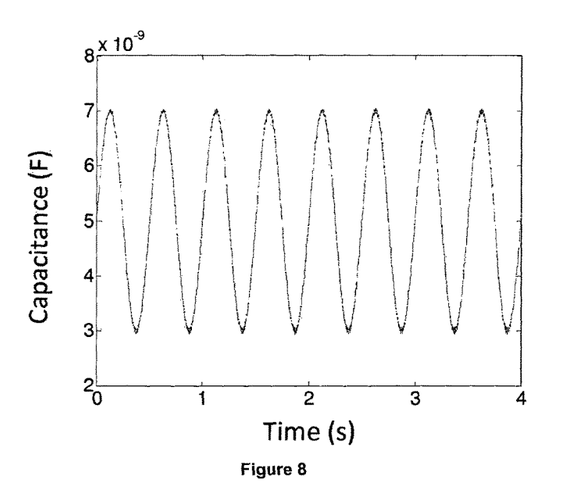
FIG. 8 shows simulated and estimated capacitance waveforms of the DED in the system of FIG. 7.
Figure 9:
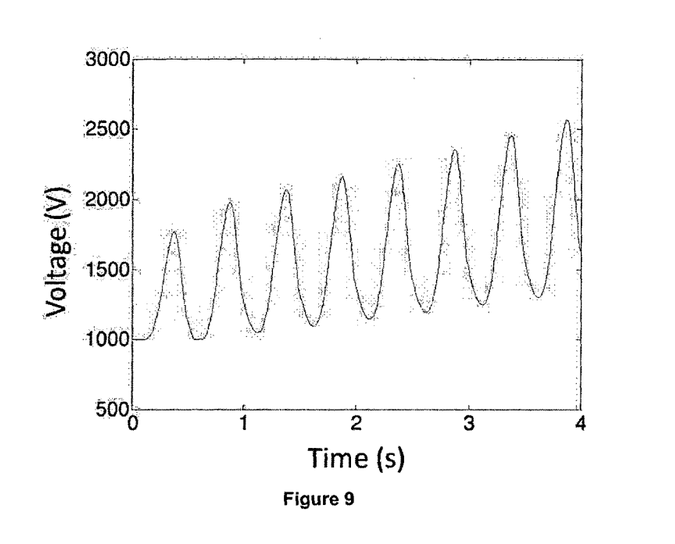
FIG. 9 shows a simulated output voltage waveform of the DED in the system of FIG. 7.

To further illustrate operation of this second embodiment of the invention, simulated waveforms of the circuit of FIG. 7 are provided in FIGS. 8 and 9. For the purpose of the simulations, the series current sensors each comprised a resistor of 60 kU, with the voltage difference across each between current sensing resistor (Sense Resistor1 to Sense Resistor 3) measured at a sampling rate of 10 kHz. The sensing signal source 30 comprised a sinusoidal signal oscillating between ±5V at a frequency of 400 Hz. The DED itself was simulated by a variable capacitance having a sinusoidal waveform at a frequency of approximately 2 Hz, representing a periodic mechanical oscillation of a DEG.

The capacitance of the DEDs was estimated using the hyperplane approximation method disclosed by WO 2012/053906, comprising the steps of: monitoring or repeatedly measuring and recording the voltage and current using current sensor 31 and voltage sensor 32; calculating the charge supplied to the DED from the measured current; and calculating one or more feedback parameters from coefficients of a plane of best fit through data derived from the measurements (i.e. the slope of the plane of best fit along relevant axes). In particular, the hyperplane space is preferably defined by orthogonal axes representing each of the potential difference across the DE, series current through the DE, and charge supplied to the DE over the period of time. The feedback parameters preferably comprise one or more of the capacitance, leakage current and electrode resistance of the DED, with the capacitance being of particular interest as it is indicative of the area or deformation of the DED. In particular, the capacitance of the DED is approximated by a first coefficient of the plane equation, said first coefficient being the coefficient of a voltage variable of the plane equation (i.e. the slope of the plane of best fit along the voltage-charge axes.

It is to be appreciated that while this hyperplane approximation method may be preferred in at least this example, any other method for calculating or estimating such information, such as the dynamic self-sensing method disclosed by WO 2010/095960, from data obtained by the current sensor 31 and optional voltage sensor 32 may alternatively be utilised without departing from the scope of the invention.

The above method would typically be performed by some sort of computing device (not shown), such as a microcontroller, communicatively coupled with the current sensor 31 and voltage sensor 32 to receive the sensed current and voltage as input data and derive feedback regarding the state of the DED by processing the input data in accordance with a suitable algorithm. The programming techniques necessary for this are well-known to those skilled in the art of computer systems. The computing device thus preferably generates a state-sensing signal indicative of the state of the DED, which may be output as feedback to a DED controller or used internally.

FIG. 8 shows both the simulated sinusoidally-varying capacitance of the DED and the estimated capacitance using the circuit of FIG. 7 and the estimated capacitance using the above-described hyperplane approximation method. The overlapping waveforms clearly indicate an excellent agreement between the simulated and estimated capacitance values. Good results were also achieved using 200 Hz sine wave and 400 Hz 5V square waveform sensing signals, showing that there is flexibility to choose an oscillating sensing signal source 30 to suite the DEG operating conditions or circuit requirements. Comparable results were also achieved using at least one alternative self-sensing method.

FIG. 9 shows the output voltage of the DEG during the same simulation, showing that it was simultaneously generating power (evident from the cyclical oscillation of the DEG voltage as the capacitance oscillates and the general upwards trend of the DEG voltage).

Figure 10:
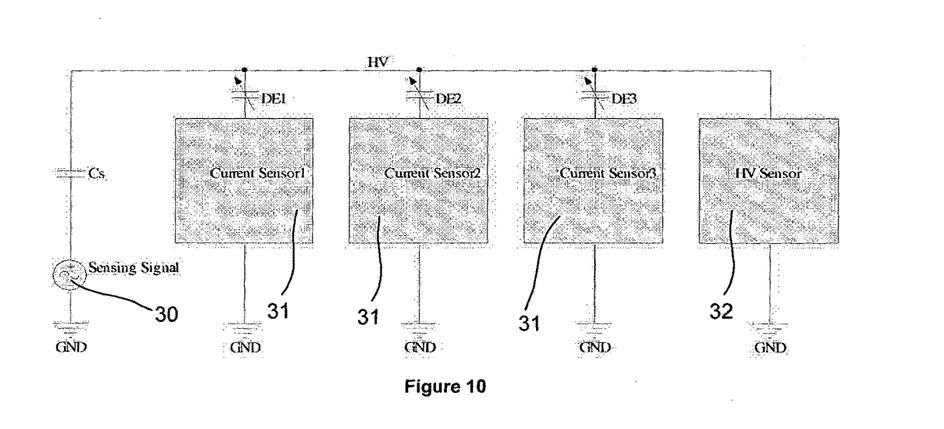
FIG. 10 is a block diagram of a third embodiment of a self-sensing dielectric elastomer device circuit according to the present invention.

A third embodiment of a self-sensing dielectric elastomer device circuit according to the present invention is shown in the block diagram of FIG. 10. This circuit addresses one challenge of the circuit of the first embodiment of FIG. 5, in which Current Sensor 1 is not referenced to ground because it is floating on top of the oscillating sensing signal. The circuit of FIG. 10 resolves this issue by applying the oscillating sensing signal to the return pin of a small fixed capacitor Cs (preferably an order of magnitude smaller than the capacitance of DEDs DE1-DE3), whereby the capacitor Cs forms a DC-blocking capacitor so that the circuitry supplying the sensing signal is not exposed to high voltages, and all current sensors are referenced to ground. The oscillating signal source is thus also decoupled from the high-voltage signal source in this embodiment of the invention.

Figure 11:
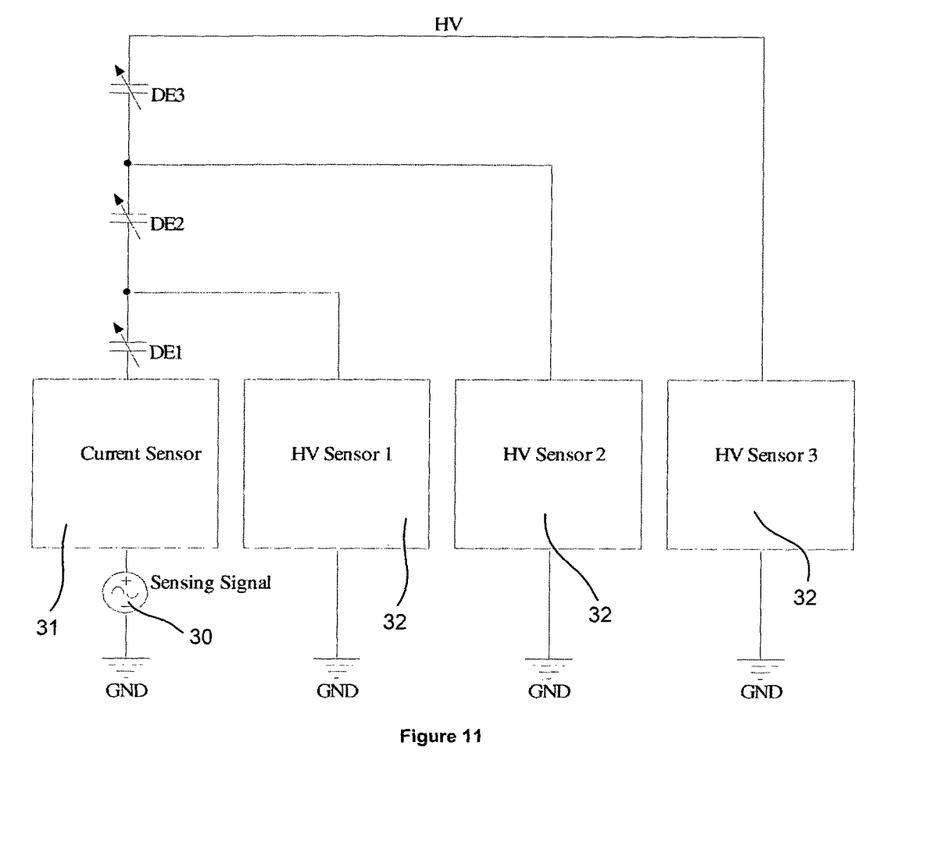
FIG. 11 is a block diagram of a fourth embodiment of a self-sensing dielectric elastomer device circuit according to the present invention.

In yet another embodiment of a self-sensing dielectric elastomer device circuit according to the present invention, the dielectric elastomer devices may be connected in series as shown in FIG. 11. By connecting the dielectric elastomer devices (in this example, DE1-DE3) in series only one current sensor is necessary, but multiple voltage sensors are required. Having only one current sensor is beneficial because self-sensing methods often require the amount of charge on the DED be calculated through integration of the current, this integration would only be required for one channel. The downside of the series arrangement is that multiple voltage sensors are required; these sensors drain charge (and therefore energy) from the DED. Thus the choice of parallel or series configuration will be application specific.

Figure 12:
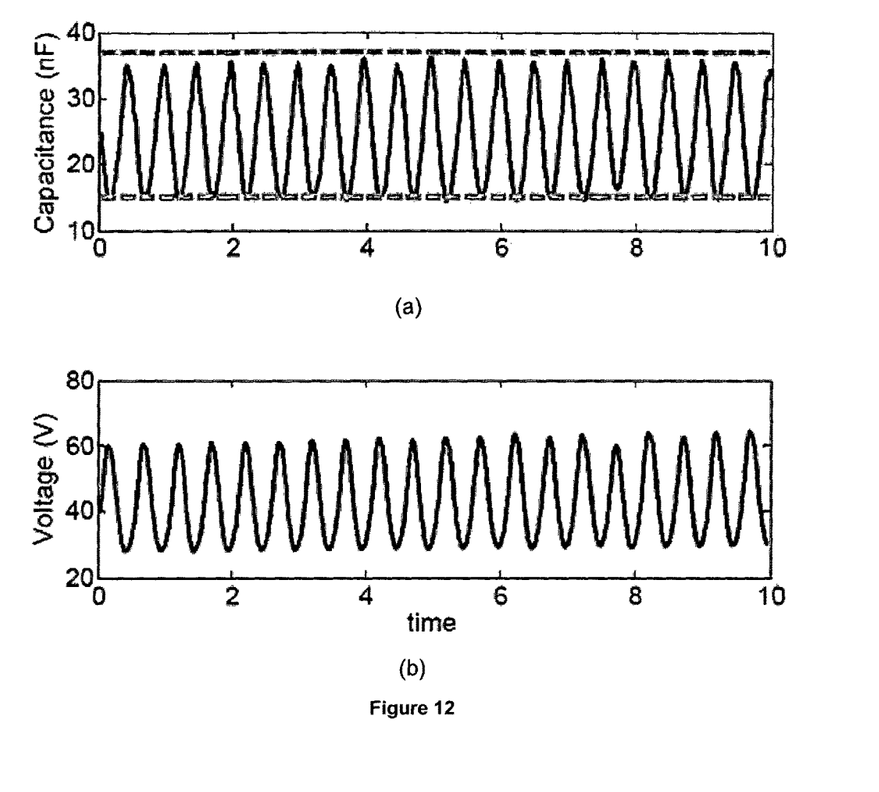

FIGS. 12(a) and 12(b) show the results from testing another embodiment of the invention. The circuit in this embodiment was similar to that shown in FIG. 10, but having two parallel DEGs and the high voltage source connected to a self-priming circuit as disclosed in WO 2011/005123. The DEGs were manually hand pumped at a frequency of approximately 2 Hz. The capacitance plot of FIG. 12(a) shows the measured capacitance of one DEG and maximum and minimum values (indicated by the dashed lines) as predicted by a simple model. The simultaneously measured voltage shown in FIG. 12(b) indicates that the voltage was slowly increasing from cycle to cycle, showing the circuit is accumulating energy and therefore generating power.

In other embodiments of the invention, the voltage sensors may be omitted. In particularly, the capacitance of the DED may be estimated without sensing the voltage if the electrical system is well modeled. For example, the DED and current sensing resistor could be considered as a filter, and the capacitance estimated from the phase and magnitude response thereof.

In another embodiment, the invention provides a DED circuit having a low-voltage oscillating signal source.

In yet another embodiment, the invention provides a DED circuit having an oscillating signal source which oscillates the voltage across the DED independent of a high-voltage signal.

In a further embodiment, the invention provides a DED circuit comprising a ground-referenced oscillating signal source.

The present application has many possible applications. In particular, a self-powered sensor can be provided by combining the circuit and method of the present invention with a DEG and a suitable self-sensing method. That is, the DEG itself generates power as it is mechanically deformed, while the circuit of the present invention introduces the oscillation necessary for a self-sensing method to estimate the capacitance, and thus area or deformation, of the DEG. Power generated by the DEG may be sufficient to entirely power the oscillation and self-sensing circuits for an entirely self-sufficient sensor, or may supplement or recharge a battery.

Possible applications of such self-powered sensors may include sports apparel with soft DEG sensors integrated to monitor joint movements, or arrays of self-powered sensors for structural health monitoring where battery replacement or wiring to large arrays may be impractical, for example.

Besides applications such as self-powered sensors, the ability to monitor both the electrical and mechanical states of DEGs provides feedback that could be used to develop closed-loop control strategies enabling enhanced DEG performance. In particular, feedback obtained using the present invention provide an indication of how close a DEG is to failure or measures losses, through indicators such as leakage current. This information can be used to produce enhanced control strategies. For instance, energy generation and DEG reliability could be maximized by controlling the charge state of the DEG so that it operates within its failure envelope or to minimise losses through leakage currents, or the stiffness of the DEG could be controlled so that it resonates at the mechanical stimulus frequency. Such feedback at present may only be provided by external sensors which are not well impedance matched to DEGs, expensive, and/or inefficient.

The circuit configuration is also suitable for monitoring multiple DEG at once, enabling cost-effective multi-degree of freedom sensors so that a stretch field could be determined. This, for example, could be used to determine the stress distribution on the insole of a shoe.

The circuit can also be used with dielectric elastomer actuators. Since the circuit does not require the high voltage electronics of the prior art, it provides a relatively cheap alternative for self-sensing DEAs. Alternatively, the circuit may be used with dedicated dielectric elastomer sensors (i.e. DEDs which neither actuate nor generate).

From the foregoing it will be seen that a circuit and/or method is provided which enables self-sensing dielectric elastomer devices to be implemented without the need for high voltage oscillation. In particular, this enables self-sensing to be implemented in a dielectric elastomer generator which typically lacks the permanent high-voltage connection of a dielectric elastomer actuator. The invention has the additional or alternative advantage that the DED voltage oscillations required for self-sensing can be introduced with purely low-voltage electronics. The invention can be applied in dielectric elastomer actuator systems, and has the advantage of simplifying design of the actuating signal source which no longer needs to provide the oscillations required for self-sensing.

It will be apparent that the DED self-sensing circuit of the present invention may comprise a single DED, or a plurality of DEDs. Any reference to a "first DED" in the description in claims is not to be taken as an implication that the circuit necessarily comprises a plurality of DEDs. The "first DED" may, in at least some embodiments, be the only DED in the circuit or system.

Unless the context clearly requires otherwise, throughout the description, the words "comprise", "comprising", and the like, are to be construed in an inclusive sense as opposed to an exclusive or exhaustive sense, that is to say, in the sense of "including, but not limited to".

Although this invention has been described by way of example and with reference to possible embodiments thereof, it is to be understood that modifications or improvements may be made thereto without departing from the scope of the invention. The invention may also be said broadly to consist in the parts, elements and features referred to or indicated in the specification of the application, individually or collectively, in any or all combinations of two or more of said parts, elements or features. Furthermore, where reference has been made to specific components or integers of the invention having known equivalents, then such equivalents are herein incorporated as if individually set forth.

Any discussion of the prior art throughout the specification should in no way be considered as an admission that such prior art is widely known or forms part of common general knowledge in the field.

The invention claimed is:

1. A self-sensing dielectric elastomer device (DED) circuit comprising:
    a first DED coupled or adapted for coupling to a first voltage source;
    a current sensor provided in series with the first DED; and
    an oscillating signal source coupled to the first DED and adapted to cause an oscillation in a voltage across the DED, wherein the oscillating signal source is decoupled from the first voltage source and is a ground-referenced signal source.

2. The circuit of claim 1, wherein the oscillating signal source is coupled to a low voltage electrode of the first DED.

3. The circuit of claim 1, wherein the oscillating signal source is coupled to a low-voltage electrode of a capacitor provided in parallel with the first DED.

4. The circuit of claim 1, wherein the DED comprises a dielectric elastomer generator (DEG) And the first voltage source is preferably adapted to selectively source and sink current to/from the DED, to prime and discharge the DED respectively.

5. The circuit of claim 1, wherein the DED comprises a dielectric elastomer actuator (DEA) And the first voltage source is adapted to provide an actuating signal to the DEA.

6. The circuit of claim 1, wherein the first voltage source is electrically connected to a first terminal of the first DED and the oscillating signal source is electrically connected to a second terminal of the first DED.

7. The circuit of claim 1, comprising one or more further DEDs, each provided in parallel with the first DED, and a further current sensor provided in series with each of the one or more further DEDs.

8. The circuit of claim 1, comprising one or more further DEDs each provided in series with the first DED.

9. A self-sensing DED system comprising a self-sensing DED circuit according to claim 1 and a charge control circuit or a first voltage source in parallel with the selfsensing DED circuit.

10. The system of claim 9 wherein the DED comprises a dielectric elastomer generator (DEG), and the system further comprises a charge control circuit provided in parallel with the self-sensing DED circuit.

11. The system of claim 9 wherein the DED comprises a dielectric elastomer actuator (DEA), and the system further comprises the first voltage source in parallel with the self-sensing DED circuit to selectively actuate the DEA.

12. The system of claim 9, further comprising a computing device communicatively coupled to the current sensor to calculate at least one feedback parameter regarding the state of the DED.

13. The system of claim 12, wherein the computing device is adapted to calculate the at least one feedback parameter by way of a plane approximation method.

14. A dielectric elastomer device (DED) self-sensing method comprising the steps of:
    providing an oscillating voltage to a first DED, the oscillating voltage being decoupled from a first voltage source coupled or coupleable to the DED;
    receiving measurements of current in series with the first DED; and
    calculating at least one feedback parameter regarding the state of the first DED, based at least in part on the current measurements,
    wherein the oscillating voltage is a ground-referenced oscillating voltage signal.

15. The self-sensing method of claim 14, wherein the oscillating voltage is a low-voltage signal independent from a high-voltage signal supplied by the first voltage source.

16. The self-sensing method of claim 14, wherein the step of providing the oscillating voltage to the first DED comprises at least one of:
    providing the oscillating voltage to a low-voltage electrode of the DED; and
    providing the oscillating voltage to a low-voltage electrode of a capacitor in parallel with the DED.

17. The self-sensing method of claim 14, wherein the method further comprises receiving measurements of voltage across the first DED, and calculating at least one feedback parameter regarding the state of the first DED based at least in part on both the current measurements and the voltage measurements.

18. The self-sensing method of claim 14, wherein the step of calculating the at least one feedback parameter is performed by a computing device which receives the current measurements as input data and calculates said feedback parameter by processing the measurements.

19. The self-sensing method of claim 18, wherein the feedback parameter is represented by a state-sensing signal generated by the computing device.

20. The self-sensing method of claim 14, wherein the method further comprises receiving measurements of current in series with one or more further DEDs provided in parallel with the first DED, and calculating at least one feedback parameter regarding the state of each of the further DEDs based at least in part on the respective current measurements.

21. The self-sensing method of claim 14, wherein the method further comprises receiving measurements of voltage across one or more further DEDs provided in series with the first DED, and calculating at least one feedback parameter regarding the state of each of the further DEDs based at least in part on the current measurements and the respective voltage measurements of each of the further DEDs.

22. The self-sensing method of claim 14, further comprising the step of recording the current measurements with respect to time.

23. The self-sensing method of claim 14, wherein the method further comprises receiving measurements of voltage across the DED, and the step of calculating at least one feedback parameter comprises the steps of:
   calculating the charge supplied to the DED with respect to time from the current measurements; and
   calculating one or more feedback parameters from coefficients of a plane of best fit through at least the charge and voltage measurements with respect to time, when defined as orthogonal axes.

24. A method for controlling a DED, comprising:
   obtaining feedback regarding the state of a DED according to the self-sensing method of claim 14; and
   controlling the DED at least in part on the basis of said feedback.

25. The method of claim 24, wherein the DED comprises a DEG, and the method further comprises:
   priming the DEG upon mechanical deformation thereof by supplying electrical energy to a high-voltage electrode of the DEG; and
   extracting electrical energy from the high-voltage electrode upon relaxation of the DEG.

26. The method of claim 24, wherein the DED comprises a DEA and the method further comprises actuating the DEA by supplying an actuation voltage correlating with an error between a desired state of the DEA and a sensed state of the DEA indicated by the feedback.

27. The method of claim 24, wherein the feedback is used to control one or more of:
   the stiffness of the DED to tune resonance; and
   the voltage across the DED to limit the leakage current.

28. A method of sensing a state of a dielectric elastomer device having a first electrode and a second electrode, the method characterised by the steps of:
   providing a ground-referenced oscillating signal to a first electrode of the dielectric elastomer device, wherein the ground-referenced oscillating signal is decoupled from the second electrode;
   sensing a current in series with the dielectric elastomer device; and
   generating a state-sensing signal dependent on the sensed current.

29. The method of claim 28, wherein the sensing signal is used as feedback on the state of the dielectric device.

30. A method for sensing mechanical strain and/or movement using a dielectric elastomer device having a high voltage electrode and a low voltage electrode, the method characterized by the steps of:
   oscillating voltage at the low-voltage electrode of the device, wherein the oscillating voltage is decoupled from the high voltage electrode;
   sensing a series current through the dielectric device; and
   generating a state-sensing signal dependent on the sensed current to sense the state of the strain and/or movement.

* * * * *